United States Patent [19]
Hung et al.

[11] Patent Number: 5,412,679
[45] Date of Patent: May 2, 1995

[54] OPTICAL WAVEGUIDE EPITAXIALLY GROWN ON SEMICONDUCTORS FOR UPCONVERSION

[75] Inventors: Liang-Sun Hung, Webster; Gustavo R. Paz-Pujalt, Rochester, both of N.Y.

[73] Assignee: Eastman Kodak Company, Rochester, N.Y.

[21] Appl. No.: 195,239

[22] Filed: Feb. 14, 1994

[51] Int. Cl.6 .................................. H01S 3/19
[52] U.S. Cl. ...................................... 372/45
[58] Field of Search ........................ 372/45, 49, 50

[56] References Cited

U.S. PATENT DOCUMENTS

| | | | |
|---|---|---|---|
| 4,637,029 | 1/1987 | Hayakawa et al. | 372/45 |
| 5,181,218 | 1/1993 | Ishikawa et al. | 372/45 |
| 5,251,225 | 10/1993 | Eglash et al. | 372/45 |
| 5,290,730 | 3/1994 | McFarlane et al. | 372/41 |

*Primary Examiner*—Rodney B. Bovernick
*Assistant Examiner*—Robert E. Wise
*Attorney, Agent, or Firm*—Raymond L. Owens

[57] ABSTRACT

A multilayer structure is disclosed which includes a single crystal semiconductor substrate. On the substrate is an epitaxial buffer layer, and on the buffer is an epitaxial fluoride outer layer exhibiting upconversion excitation upon red or infrared irradiation.

6 Claims, 4 Drawing Sheets

OPTICAL WAVEGUIDE EPITAXIALLY GROWN ON SEMICONDUCTORS FOR UPCONVERSION

FIELD OF THE INVENTION

This invention relates to a multilayer upconversion structure.

BACKGROUND OF THE INVENTION

Upconversion lasers represent a class of optically-pumped lasers that oscillate at frequencies higher than those used for pumping. The lasers produce output at wavelengths from violet to red spectral regions using infrared pump wavelengths accessible with III-V semiconductor lasers. Those compact light sources are important in optical data storage, high-speed laser printers, large-screen displays, and undersea communications. Materials commonly used for upconversion lasers include Er-doped $BaY_2F_8$ and Tm-doped $YLiF_4$. Paz-Pujalt, Hung, Chwalek, Hrycin, Chatterjee, and Richards U.S. Ser. No. 08/186,400, filed Jan. 25, 1994, entitled "A Device for Converting Invisible and Visible Radiation to Visible Light And/Or UV Radiation", discloses articles in which a crystalline layer of Tm-doped $BaYYbF_8$ on a substrate exhibits upconversion excitation. Still it would be desirable to integrate epitaxial films of upconversion materials on GaAs and other III-V semiconductors. Hung, Agostinelli, and Mir U.S. Ser. No 07/992 213, now U.S. Pat. No. 5,347,157, filed Dec. 7, 1992, titled "A Multilayer Structure Having a (111)-Oriented Buffer Layer" discloses a structure comprised of a GaAs substrate and a nonlinear optical waveguide epitaxially grown on the substrate.

SUMMARY OF THE INVENTION

It is an object of this invention to provide an upconversion waveguide epitaxially grown on semiconductors.

This object is achieved in a multilayer structure comprising:

a single crystal semiconductor substrate;

an epitaxial buffer layer overlaying the substrate; and an epitaxial fluoride outer film layer exhibiting upconversion excitation upon red or infrared irradiation.

An advantage of a multilayer structure in accordance with this invention is that the integration of upconversion films with semiconductor substrates allows diode lasers, upconversion light sources, light detectors, and electronics grown on the same chip, and that the formation of waveguides with good epitaxial quality permits large power densities over longer optical lengths.

DETAILED DESCRIPTION OF THE PREFERRED EMBODIMENT

Figure 1:
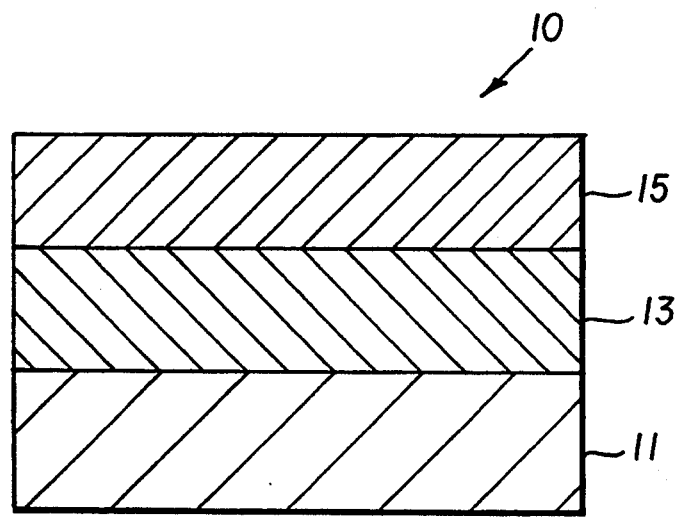
FIG. 1 is a schematic diagram of an embodiment of the multilayer structure of the invention.
Figure 2:
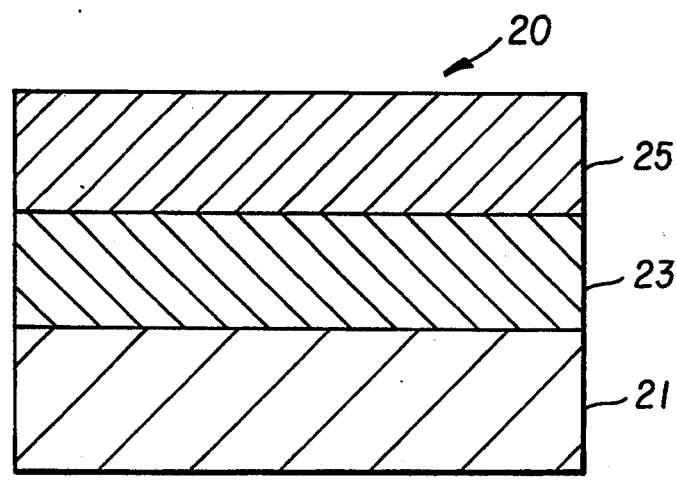
FIG. 2 is a schematic diagram of an alternative embodiment of the multilayer structure of the invention.
Figure 3:
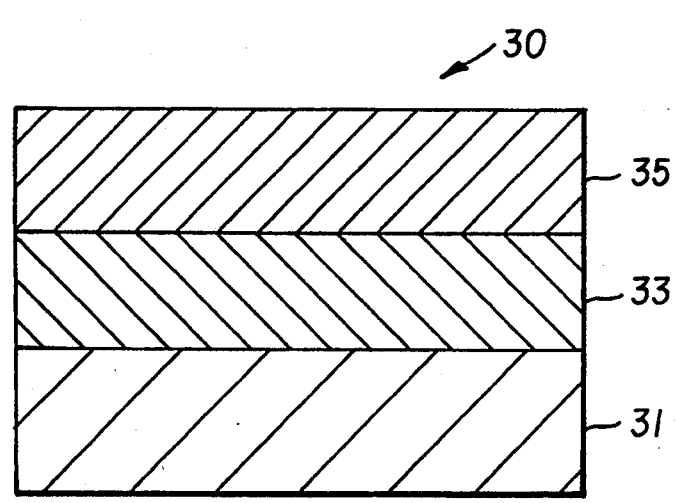
FIG. 3 is a schematic diagram of another alternative embodiment of the multilayer structure of the invention.

Referring to FIG. 1, multilayer structure 10 includes a single crystal semiconductor substrate 11, an epitaxial buffer fluoride layer 13, and an upconversion fluoride film 15 grown epitaxially on the substrate 11 and forming a waveguide with its underlying buffer layer 13. Another embodiment of the invention is shown in FIG. 2. A multilayer structure 20 includes a (100)-oriented single crystal Si or GaAs 21, an epitaxial buffer layer $CaF_2$ 23, and a doped upconversion film $BaYYbF_8$ 25 grown epitaxially on Si or GaAs and forming a waveguide with $CaF_2$. Still another embodiment of the invention is shown in FIG. 3. A multilayer structure 30 includes a (100)-oriented single crystal Si or GaAs 31, an epitaxial buffer layer LiF 33, and a doped upconversion film $BaYYbF_8$ 35 grown epitaxially on Si or GaAs and forming a waveguide with LiF.

The utilization of various types and sizes of a substrate is possible with the limitation that the selected substrate is a semiconductor selected from Group III-Group V compounds or Group IV. Desirably, the substrate is a semiconductor selected from GaAs. GaP, InAs, GaSb, InSb, and their ternary compounds such as $Al_xGa_{1-x}As$. Preferred Group IV substrates are selected from the group of Si, Ge, and $Si_xGe_{1-x}$, where x is from 0 to 1.

The substrates can be undoped, lightly doped or heavily doped semiconductors. In some applications the heavily doped semiconductor is more desirable because an electrode can be formed underneath the buffer layer. In some applications, a part of the semiconductors can be used as substrate 11, 21, or 31 for the multilayer structure, while the remaining part of the semiconductor wafer can be processed to form laser diodes and a variety of electronic devices.

The buffer layer 13 in FIG. 1 must provide the following: 1) impedes the reaction between the outer fluoride film and the underlying semiconductor substrate, 2) is stable relative to the outer fluoride film and the underlying semiconductor substrate at elevated temperatures, 3) is a single crystal film having the same rotation symmetry and sublattice constants as that of the substrate about the surface normal, 4) acts as a seed for the epitaxial growth of the outer fluoride film, 5) is transparent over a wide range of wavelengths, and 6) is an optical film with a lower refractive index than the upconversion film.

This minimum characteristics are mandated characteristics of the various possibility of the buffers. Conventional barrier which maintains the minimum characteristics set forth above, can be utilized in the invention. A variety of fluorides can be selected, such as $CaF_2$, $SrF_2$, $BaF_2$, $Ca_xSr_{1-x}F_2$, $MgF_2$, and LiF, where x is from 0 to 1.

The barrier layer 13 is epitaxially grown on the semiconductor substrate. The buffer layer 13 can be grown epitaxially by many conventional manners, such as laser ablation, sputtering, electron-beam evaporation, thermal evaporation or chemical vapor deposition. When the buffer layer 13 is being grown it is necessary that said buffer attains a sufficient thickness to impede a reaction between the substrate and the overlying film. Another consideration on film thickness is that the strength of the evanescent tail of the mode of the wave propagating in the upconversion film should be negligible at the substrate-buffer layer interface to prevent guided wave loss. A sufficient thickness ranges from 200 to 3000 nm, preferably 500–2000 nm.

The overlying upconversion film can be grown by any conventional methods, such as rf-sputtering, electron-beam evaporation, thermal evaporation, laser ablation, or metal organic chemical vapor deposition. The overlying fluoride film shown in FIG. 1, desirably, has a crystal structure matching that of its underlying semiconductor substrate and exhibits substantial upconversion effects. Films that fulfill the two combined criteria are, for example, $BaY_2F_8$, $BaYYbF_8$, and $YLiF_4$. A sufficient thickness ranging from 200 to 3000 nm is required, preferably 500–2000 nm. The film may be doped with Ho, Er, Nd, Pr and Tm.

Experimental details $(NH_4)_2S_x$-treated (111) GaAs wafers were used as substrates for epitaxial growth of fluoride films. After a conventional cleaning in organic solvents, the wafers were etched in a solution with $H_2SO_4$: $H_2O_2$: $H_2O = 1$: 8: 500 for 30 s, followed by a deionized water rinse. Prior to being loaded in an evaporator, the samples were placed in a saturated $(NH_4)_2S_x$ solution for 3–5 min. Following this soak, the ammonium sulfide solution was diluted with deionized water and the samples were immersed in the diluted solution for 3–5 min before being dried under a stream of nitrogen. This method allows us to grow epitaxial films on GaAs without in situ thermal etching or sputter cleaning.

Either $CaF_2$ or LiF was deposited directly on GaAs by electron-beam evaporation. The deposition process was carried out at $1 \times 10^{-7}$ Torr, and the substrate was heated by a radiative heater consisting of tantalum wires. The growth temperature was 400° C.–550° C. and monitored by an infrared pyrometer using published emissivity values. The deposition rate was 0.1–0.4 nm/s and the thickness of the $CaF_2$ or LiF films was about 300–500 nm.

The source used for $BaYYbF_8$ was prepared from powders using electronic grade $BaF_2$, $YF_3$, $YbF_3$, and $TmF_3$ having a mole ratio of 1: 1: 0.99: 0.01. The mixed powders were pelletized under a pressure of 500 psi. Tm-doped $BaYYbF_8$ films were deposited on $CaF_2$- or LiF-covered (100) GaAs by e-beam evaporation. The deposition was carried out at a rate of 0.1–0.4 nm/s at temperatures of 400° C.–550° C., and the thickness of the $BaYYbF_8$ films was about 300–500 nm. In addition to Tm other elements can be used as dopants, Ho, Er, Nd, Tm, Pr.

The samples were characterized by x-ray diffraction and Rutherford backscattering. These techniques are well known and are illustrated by B. D. Cullity, Elements of x-ray Diffraction (Addison-Wesley, Reading, MA) and by W.-K. Chu, J. W. Mayer, and M.-A. Nicolet, Backscattering Spectrometry (Academic Press, New York, NY). The following examples are presented for a further understanding of the invention.

EXAMPLE 1

Figure 4:
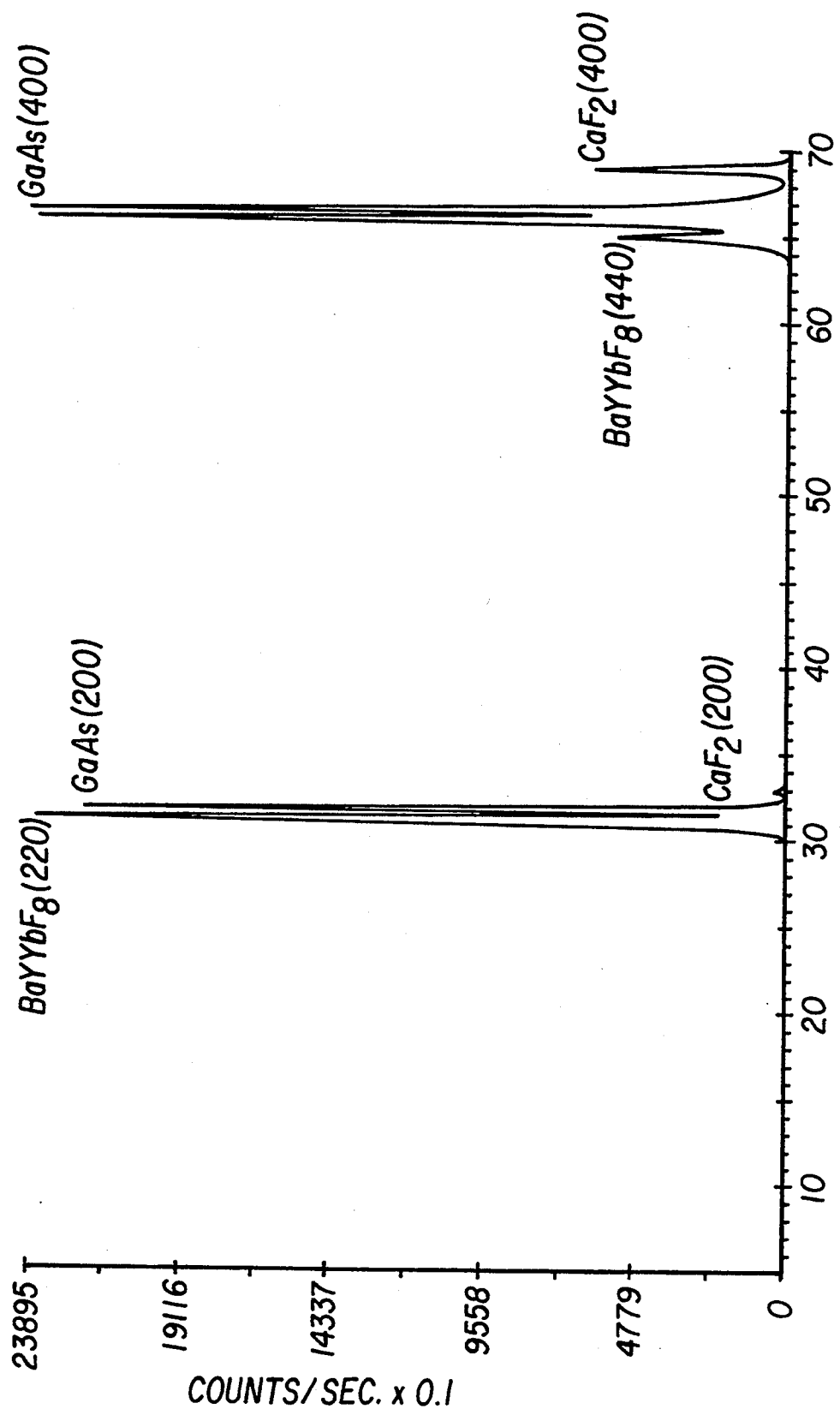
FIG. 4 is a x-ray diffraction pattern of the structure shown in FIG. 2.
Figure 5:
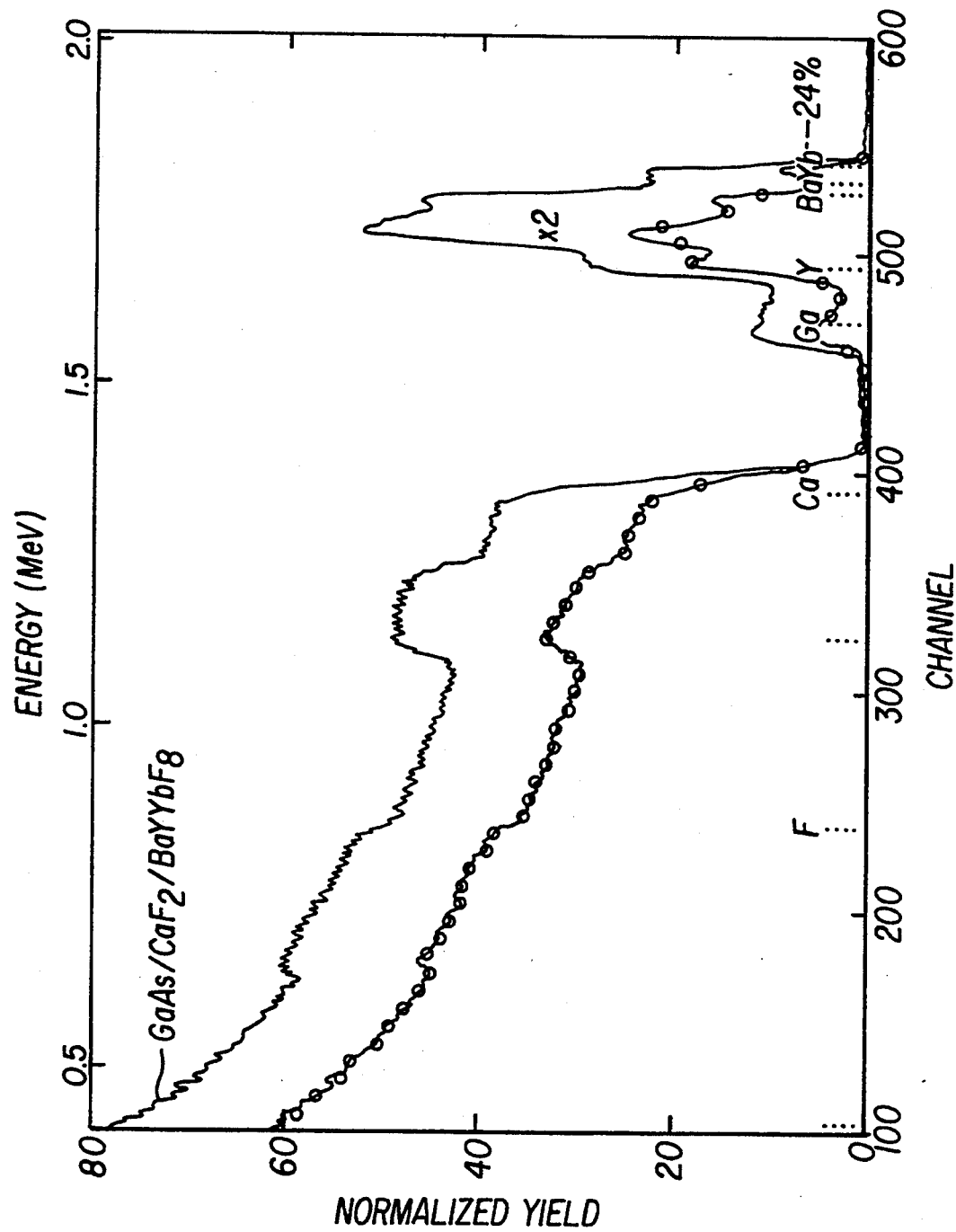
FIG. 5 shows Rutherford backscattering spectra of the structure in FIG. 2 with the analyzing beam at both a random and a <100>-aligned incidence relative to GaAs.

300 nm of $CaF_2$ and 300 nm of Tm-doped $BaYYbF_8$ were sequentially deposited on a (100)-oriented GaAs single crystal substrate at 500° C. by e-beam evaporation. The sample surface is shiny and smooth. The standard 2-theta diffraction pattern in FIG. 4 taken from the multilayer structure shows only the GaAs (200) & (400), $CaF_2$ (200) & (400), and $BaYYbF_8$ (220) & (440) diffraction peaks. The full width of the rocking curves at half maximum (FWHM) is determined to be about 0.5° for $CaF_2$ (200) and 0.9° for $BaYYbF_8$ (110). X-ray analysis at a 1.5°—incidence relative to the sample surface shows no peaks other than GaAs (311). Thus both $CaF_2$ and $BaYYbF_8$ are not only highly oriented, but also have a good in-plane alignment with GaAs, indicating $CaF_2$ and $BaYYbF_8$ epitaxially grown on GaAs. The good crystal quality of the $BaYYbF_8$ film has been further verified by ion channeling analysis showing a minimum yield of about 0.24 (FIG. 5). The values of the refractive index are known to be 1.43 and 1.54 for $CaF_2$ and $BaYYbF_8$, respectively, so that a waveguide is formed. Upon stimulation by a 647.1 nm laser beam the films underwent upconversion excitation, resulting in emitting UV, blue, and green radiation. When pumped by a 960 nm laser beam, UV, blue, green and red lights were observed.

EXAMPLE 2

Figure 6:
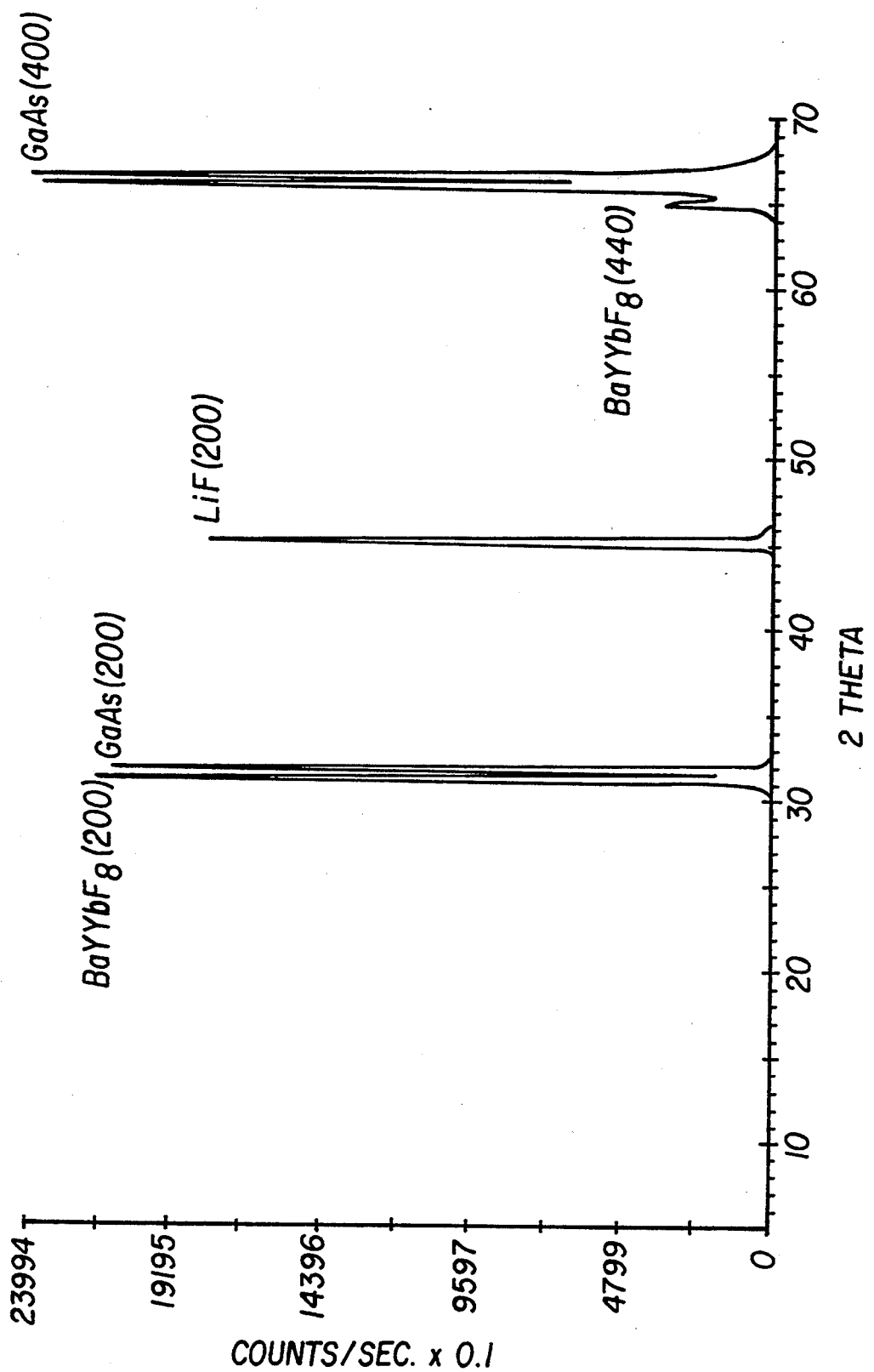
FIG. 6 is a x-ray diffraction pattern of the structure shown in FIG. 3.

A thin film of LiF with a thickness of 300–500 nm was deposited on a (100)-oriented GaAs single crystal substrate at 400° C., and a layer of $BaYYbF_8$ with a thickness of 300–500 nm was then deposited on the LiF coated substrate at 500° C. by e-beam evaporation. The sample surface is smooth and featureless. X-ray analysis reveals only the presence of the GaAs (200) & (400), LiF(200), and $BaYYbF_8$ (110) & (220) diffraction peaks in the x-ray diffraction pattern of FIG. 6. The values of the refractive index are known to be 1.36 and 1.55 for LiF and $BaYYbF_8$, respectively. Upon stimulation by a 647.1 nm laser beam the LiF film underwent upconversion excitation, resulting in emitting UV, blue, and green radiation when pumped by a 960 nm laser beam UV, blue, green, and red lights were observed.

The invention has been described in detail with particular reference to certain preferred embodiments thereof, but it will be understood that variations and modifications can be effected within the spirit and scope of the invention.

Parts List 10 multilayer
11 single crystal semiconductor
13 epitaxial buffer layer
15 epitaxial upconversion layer
20 multilayer
21 single crystal Si or GaAs
23 epitaxial $CaF_2$ layer
25 epitaxial doped $BaYYbF_8$ layer
30 multilayer
31 single crystal Si or GaAs
33 epitaxial LiF layer
35 epitaxial doped $BaYYbF_8$ layer

We claim:

1. A multilayer structure comprising:
   a single crystal semiconductor substrate;
   an epitaxial buffer layer overlaying the substrate; and
   an epitaxial fluoride outer film layer exhibiting upconversion excitation upon red or infrared irradiation wherein said epitaxially fluoride layer is $BaY_2F_8$, $BaYYbF_8$, or $YLiF_4$ doped with Ho, Er, Nd, Tm, or Pr.

2. The multilayer structure according to claim 1 wherein said substrate is selected from Group III-Group V compounds such as GaAs, GaP, InAs, GaSb, InSb, and $Al_xGa_{1-x}As$, and selected from Group IV such as Si, Ge, and $Si_xGe_{1-x}$, where x is from 0 to 1.

3. The multilayer structure according to claim 2 wherein said substrate is undoped, lightly doped, or heavily doped.

4. The multilayer structure according to claim 1 wherein said buffer layer structurally matches both said substrate and upconversion layer, and has an index of refraction lower than that of said upconversion layer.

5. The multilayer structure according to claim 4 wherein said buffer layer is a metal fluoride.

6. The multilayer structure according to claim 5 wherein said buffer layer is selected from $CaF_2$, $SrF_2$, $Ca_xSr_{1-x}F_2$, $BaF_2$, $MgF_2$ or $LiF$, where x is from 0 to 1.

* * * * *